(12) United States Patent
Sun

(10) Patent No.: US 12,538,652 B2
(45) Date of Patent: Jan. 27, 2026

(54) DISPLAY SCREEN AND ELECTRONIC DEVICE

(71) Applicant: GUANGDONG OPPO MOBILE TELECOMMUNICATIONS CORP., LTD., Guangdong (CN)

(72) Inventor: Zhou Sun, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 569 days.

(21) Appl. No.: 18/087,278

(22) Filed: Dec. 22, 2022

(65) Prior Publication Data

US 2023/0132145 A1 Apr. 27, 2023

Related U.S. Application Data

(63) Continuation of application No. PCT/CN2021/091927, filed on May 6, 2021.

(30) Foreign Application Priority Data

Jun. 22, 2020 (CN) .......................... 202010571718.1

(51) Int. Cl.
*G09G 3/32* (2016.01)
*H10K 59/121* (2023.01)
(Continued)

(52) U.S. Cl.
CPC ......... *H10K 59/121* (2023.02); *H10K 59/353* (2023.02); *H10K 59/60* (2023.02); *H10K 2102/102* (2023.02); *H10K 2102/103* (2023.02)

(58) Field of Classification Search
CPC .... H10K 59/121; H10K 59/353; H10K 59/60; H10K 2102/102; H10K 2102/103;
(Continued)

(56) References Cited

U.S. PATENT DOCUMENTS

| 11,574,992 B2 * | 2/2023 | Ma ..................... H10K 59/1315 |
| 2008/0106628 A1 | 5/2008 | Cok et al. |

(Continued)

FOREIGN PATENT DOCUMENTS

| CN | 202837748 U | 3/2013 |
| CN | 108364957 A | 8/2018 |

(Continued)

OTHER PUBLICATIONS

Extended European Search Report for EP Application 21829898.2 mailed Sep. 18, 2023. (13 pages).

(Continued)

*Primary Examiner* — Pegeman Karimi
(74) *Attorney, Agent, or Firm* — Young Basile Hanlon & MacFarlane, P.C.

(57) ABSTRACT

A display screen includes a first display area, which is provided with a first pixel unit array, and a second display area, which is provided with a second pixel unit array, wherein the pixel density of the first display area is less than that of the second display area, the first display area includes a first sub-area and a second sub-area, and the second sub-area is connected to the first sub-area and the second display area; and the display screen further includes a pixel driving unit array, which is arranged in the second sub-area, wherein each pixel driving unit respectively drives each first pixel unit, a first number of rows of pixel driving units are arranged corresponding to a second number of rows of first pixel units in a row extension direction, and the first number is greater than the second number. Also disclosed is an electronic device.

20 Claims, 5 Drawing Sheets

(51) Int. Cl.
*H10K 59/35* (2023.01)
*H10K 59/60* (2023.01)
*H10K 102/10* (2023.01)

(58) Field of Classification Search
CPC ... G09G 2300/0426; G09G 2300/0452; G09G 3/3225; G09F 9/35; G09F 9/33
See application file for complete search history.

(56) References Cited

U.S. PATENT DOCUMENTS

| | | | |
|---|---|---|---|
| 2015/0279266 | A1 | 10/2015 | Onoyama et al. |
| 2019/0393286 | A1 | 12/2019 | Ding et al. |
| 2020/0312832 | A1* | 10/2020 | Chi ........................ H01L 25/18 |
| 2020/0411607 | A1* | 12/2020 | Jian ........................ H10K 59/60 |
| 2021/0065625 | A1* | 3/2021 | Wang ..................... H10K 59/353 |
| 2021/0265430 | A1* | 8/2021 | Chang ................... H10K 59/353 |

FOREIGN PATENT DOCUMENTS

| | | |
|---|---|---|
| CN | 109119454 A | 1/2019 |
| CN | 109599053 A | 4/2019 |
| CN | 209103799 U | 7/2019 |
| CN | 110365819 A | 10/2019 |
| CN | 110504289 A | 11/2019 |
| CN | 110767159 A | 2/2020 |
| CN | 110854178 A | 2/2020 |
| CN | 110874990 A | 3/2020 |
| CN | 210245501 U | 4/2020 |
| CN | 111180483 A | 5/2020 |
| CN | 111192902 A | 5/2020 |
| CN | 111261677 A | 6/2020 |
| CN | 111681565 A | 9/2020 |
| WO | 2020098043 A1 | 5/2020 |

OTHER PUBLICATIONS

Chinese First Office Action with English Translation for CN Application 202010571718.1, mailed Aug. 31, 2021. (16 pages).

International Search Report and Written Opinion with English Translation for PCT Application PCT/CN2021/091927 mailed Jul. 26, 2021. (13 pages).

* cited by examiner

DISPLAY SCREEN AND ELECTRONIC DEVICE

CROSS-REFERENCE TO RELATED APPLICATION(S)

This application is a continuation-application of the International Patent Application No. PCT/CN2021/091927, filed on May 6, 2021, which claims the priority of the patent application No. 202010571718.1, filed on Jun. 22, 2020, which is hereby incorporated by reference in its entirety.

TECHNICAL FIELD

The present disclosure relates to the field of electronics, and in particular to a display screen and an electronic device.

BACKGROUND

In related art, a mobile phone having a full screen is a main trend in the development of mobile phones. In order to achieve full-screen display, a camera is placed below a display screen. While capture images, light can firstly pass through the display screen and then enter the camera under the display screen, such that a photographing function of the camera is achieved. For a photographing region under the display screen, a problem of low light transmittance of the display screen and severe diffraction may need to be solved, such that the camera under the display screen may capture images and exhibit a normal imaging effect.

SUMMARY

According to the present disclosure, a display screen includes: a first display region, arranged with an array of first pixel units; and a second display region, arranged with an array of second pixel units. A pixel density of the first display region is less than a pixel density of the second display region, the first display region comprises a first sub-region and a second sub-region, the second sub-region is adjacent to and connected with the first sub-region and the second display region. The display screen further comprises an array of pixel driving units disposed in the second sub-region, each pixel driving unit of the array of pixel driving units is configured to drive a respective one first pixel unit of the array of first pixel units. The first number of rows of pixel driving unit are arranged in a row extension direction and are corresponding to the second number of rows of first pixel units, the first number is greater than the second number.

According to the present disclosure, an electronic device includes: the display screen according to the above embodiments; and a photosensitive module, arranged at a rear side of the display screen and corresponding to the first sub-region.

BRIEF DESCRIPTION OF DRAWINGS

The above and/or additional aspects and advantages of the present disclosure will become apparent and readily understood from the following description of embodiments, referring to the accompanying drawings.

REFERENCE NUMERALS OF MAIN COMPONENTS

Figure 1:
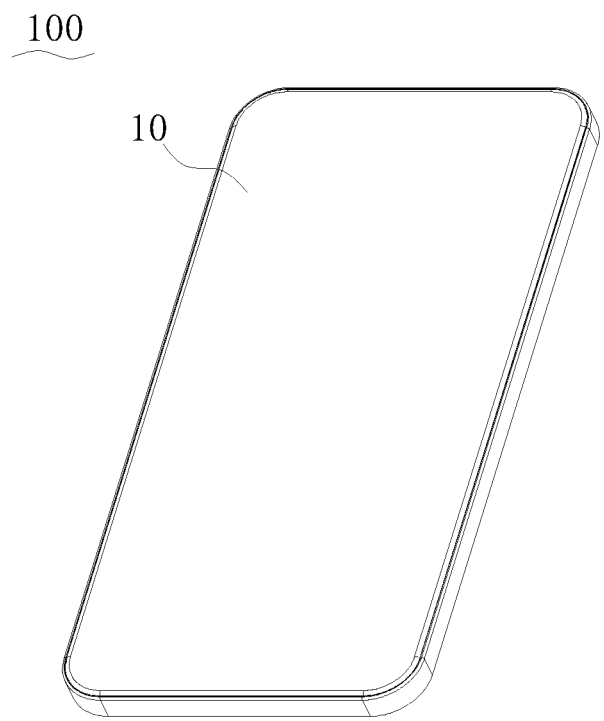
FIG. 1 is a structural schematic view of an electronic device according to an embodiment of the present disclosure.
Figure 2:
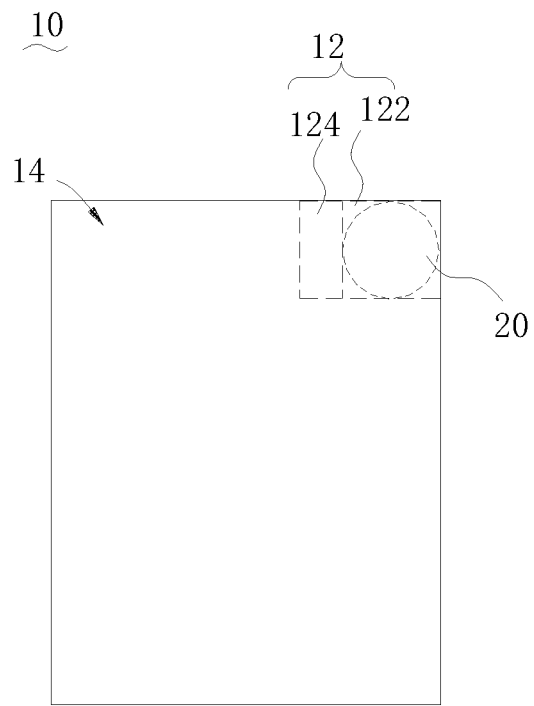
FIG. 2 is a plan view of a display screen according to an embodiment of the present disclosure.
Figure 3:
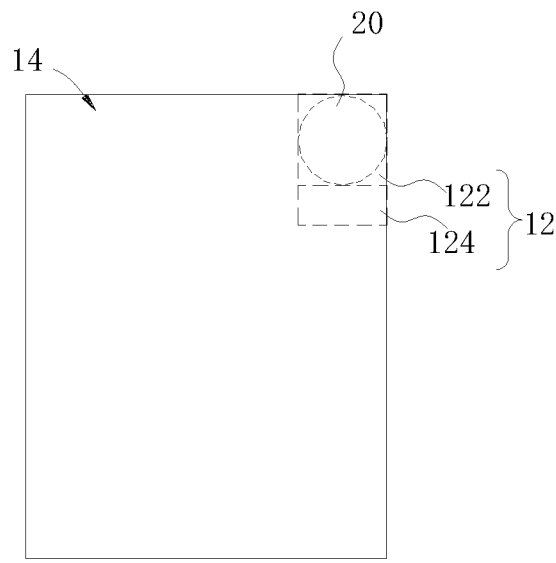
FIG. 3 is another plan view of a display screen according to an embodiment of the present disclosure.
Figure 4:
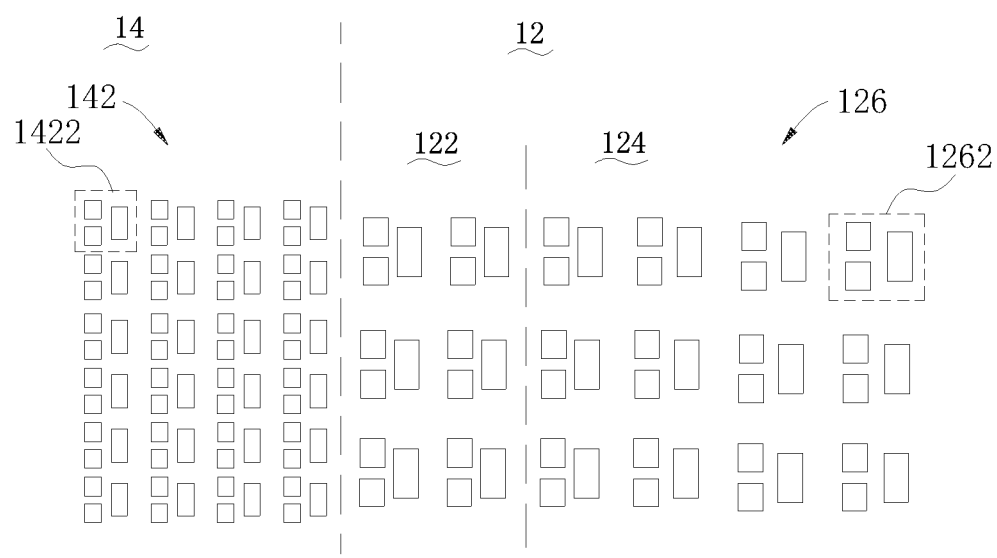
FIG. 4 is a structural schematic view of an array of pixel units of a display screen according to an embodiment of the present disclosure.
Figure 5:
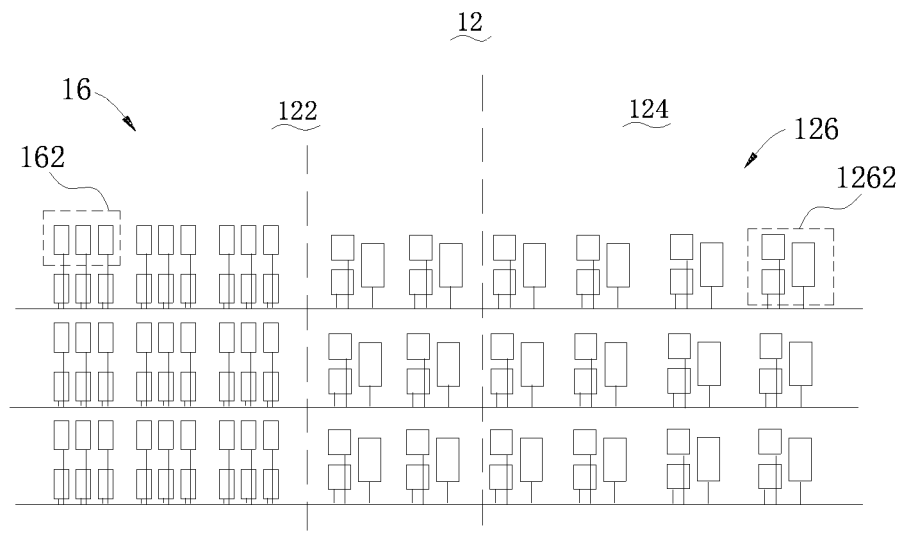
FIG. 5 is another structural schematic view of an array of pixel units of a display screen according to an embodiment of the present disclosure.

Electronic device 100, display screen 10, first display region 12, first sub-region 122, second sub-region 124, array of first pixel units 126, first pixel unit 1262, second display region 14, array of second pixel units 142, second pixel unit 1422, array of pixel driving units 16, pixel driving unit 162, and photosensitive module 20.

DETAILED DESCRIPTION

Embodiments of the present disclosure will be described in detail below, and examples of the embodiments are illustrated in the accompanying drawings. Same or similar reference numerals refer to same or similar elements or elements having same or similar functions. The embodiments described below by referring to the accompanying drawings are exemplary only, used to explain the present disclosure, and shall not be interpreted as limiting the present disclosure.

As shown in FIG. 1 to FIG. 5, a display screen 10 is provided and may be configured on an electronic device 100 to meet a user's requirement of the electronic device 100 taking a full screen to display contents. The electronic device 100 may be a device, such as a mobile phone, a tablet, a computer, and so on.

In some embodiments, the display screen 10 includes a first display region 12, which is arranged with an array of first pixel units 126, and a second display region 14, which is arranged with an array of second pixel units 142. A pixel density of the first display region 12 is less than a pixel density of the second display region 14. The first display region 12 includes a first sub-region 122 and a second sub-region 124, and the second sub-region 124 is adjacent to and connected with the first sub-region 122 and the second display region 14. The display screen 10 further includes an array of pixel driving units 16 disposed in the second sub-region 124. Each pixel driving unit 162 of the array of the pixel driving units 16 drives a respective one first pixel unit 1262 of the array of first pixel units 126. The first number of rows of pixel driving units 162 are arranged along a row extension direction and are corresponding to the second number of rows of first pixel units 1262. The first number is greater than the second number.

In the display screen 10 of the present embodiment, the first display region 12 and the second display region 14 are arranged to have different pixel densities. High light transmission is achieved in the first display region 12, which has a relatively low pixel density. At the same time, the pixel driving units 124 of the first display region 12 are arranged in the second sub-region 124, such that the pixel driving units 162 may not be arranged in the first sub-region 122. In this way, an influence on light passing through the first sub-region 124, which is caused by arranging the pixel driving units 162 in the first sub-region 124, may be avoided or reduced. In addition, the larger number of rows of pixel driving units 162 are arranged corresponding to the less number of rows of first pixel units 1262, a utilization rate of the pixel driving units 162 in the second sub-region 126 may be improved, and an area of the second sub-region 126 may be reduced. In this way, an area of the first display region 12 is reduced. Since the pixel density of the first display region 12 is low, a displaying effect is relatively poor. Reducing the area of the first display region 12 may improve an overall visual effect of the entire display screen 10.

It shall be understood that the display screen 10 may achieve a displaying function by enabling a plurality of pixel units to emit light at the same time. The plurality of pixel units may usually be misaligned with each other and arranged along different directions, forming an array. In particular, the plurality of pixel units may be misaligned with each other and arranged along two directions perpendicular to each other, forming the array. In this case, the two directions perpendicular to each other may be a row extension direction of the pixel units and a column extension direction of the pixel units. Pixel units that are arranged in the row extension direction form a pixel row, and pixel units that are arranged in the column extension direction form a pixel column. Similarly, an arrangement of the pixel driving units 162 in the array of pixel driving units 16 may be similar to the arrangement of the pixel units. In some embodiments, an arrangement direction of the pixel units is the same as an arrangement direction of the pixel driving units 162. That is, the row extension direction of the pixel units is the same as a row extension direction of the pixel driving units.

To be noted that a row and a column in the array of pixel units (the array of first pixel units 126 and the array of second pixel units 142) are relatively defined. The pixel units that are arranged in a row in the present embodiment may be arranged in a column in other embodiments, which will not be described in detail here.

In some embodiments, the number of pixel driving units 162 in the second sub-region 124 is not less than the number of first pixel units 1262 in the first display region 12.

In this way, each first pixel unit 1262 may be independently driven by a corresponding pixel driving unit 162, ensuring the displaying effect of the first display region 12. Preferably, the number of pixel driving units 162 in the second sub-region 124 is equal to the number of the first pixel units 1262.

In some embodiments, the array of first pixel units 126 includes an array of organic light emitting diode (OLED) units.

In detail, an OLED display screen 10 configured with the array of OLED units may have high light transmittance. Visible light may pass through the display screen 10 while the display screen 10 is displaying content. Therefore, an optical element may be arranged under the OLED display screen 10 and configured to sense the light passing through the display screen 10. In this way, the electronic device 100 may be prevented from defining a light-transmitting hole on a side to receive the optical element, allowing the electronic device 100 to display contents on the full screen.

Further, in some embodiments, the OLED display screen 10 may be bendable, and therefore, the OLED display screen 10 may be manufactured as a curved screen, providing a better visual effect for the user. That is, the display screen 10 may be the curved screen.

Of course, in other embodiments, the array of first pixel units 126 may be an array of micro-LED units, and a micro-LED display screen 10 configured with the array of micro-LED units also has high visible-light transmittance.

Correspondingly, in some embodiments, the array of second pixel units 142 may be an array of liquid crystal display (LCD) units, an array of OLED units, or an array of micro-LED units.

It shall be understood that the second display region 14 may be a normal display region of the display screen 10 and can display contents normally without allowing light to pass through the display screen. In this way, the array of second pixel units 142 may be the same as or different from the array of first pixel units 126. For example, a shape of a first sub-pixel of the array of first pixel units in the first display region may be the same as or different from a shape of a second sub-pixel of the array of second pixel units in the second display region. The first sub-pixel and the second sub-pixel are in a same color. In an example, the first sub-pixel in red is triangle, and the second sub-pixel in red is triangle. In another example, the first sub-pixel in red is triangle, and the second sub-pixel in red is rectangular.

Preferably, the array of second pixel units 142 is the same as the array of first pixel units 126. In this way, the display screen 10 can be integrally manufactured by performing one process, ensuring the displaying effect of the display screen 10.

To be noted that the arrays of the displaying pixel units are shown exemplarily only, and embodiments of the present disclosure are not limited thereto. The embodiments of the present disclosure will be described by taking the array of OLED units as the array of the displays pixel units.

In some embodiments, the array of pixel driving units 16 may include a thin film transistor (TFT).

In detail, the thin film transistor may include a driving TFT and a switch TFT. The switch TFT controls the driving TFT to be switched on or switched off. A current generated when the driving TFT is in a saturated state may drive the pixel units to emit light. Further, different grey-scaled voltages are input to the driving TFT to generate different drive currents, such that grey-scaled control of the display panel may be achieved. In this way, the display screen 10 may actively display contents, such that the display screen may have advantages of having a fast response speed, a high contrast ratio, and a wide viewing angle.

In some embodiments, the display screen 10 includes a transparent conductive material, and the pixel driving units 162 in the second sub-region 124 are connected to the first pixel units 1262 through the transparent conductive material.

In this way, by arranging the transparent conductive material, an influence on the light caused by lines arranged inside the display screen 10 may be reduced, ensuring the first sub-region 122 to have high light transmittance.

In an example, the transparent conductive material may be indium tin oxide (ITO) and/or indium gallium zinc oxide (IGZO). The ITO and the IGZO are highly transparent and conductive. While ensuring the light transmittance of the first display region 12, the current may be quickly conducted to drive the first pixel units 1262 to emit light, such that the display screen may display images normally.

In some embodiments, the first number of rows of pixel driving units 162 are configured to, sequentially from row to row, drive the corresponding second number of rows of first pixel units 1262.

In detail, the first sub-region 122 and the second sub-region 124 are arranged side by side along the row extension direction of the first pixel units 1262. In this case, an arrangement direction of the pixel driving units 162 in each row may be the same as an arrangement direction of the first pixel units 1262 in each row. Since the first number is greater than the second number, in order to allow the pixel driving units 162 to be fully utilized, the number of pixel driving units 162 in each row may be less than the number of first pixel units 1262 in each row. In this way, pixel driving units 162 in one row of the first number of rows may firstly drive, along the row extension direction, a part of first pixel units 1262 in one corresponding row. Subsequently and successively, pixel driving units 162 in a next row of the first number of rows may drive, along the row extension direction, a next part of first pixel units 1262 in the corresponding row, until all of the first pixel unit 162 in the corresponding row are driven. Subsequently, first pixel unit 1262 in a next row may be driven. In this way, the first number of rows of pixel driving units 162 are configured to drive, sequentially from row to row, the corresponding second number of rows of first pixel units 1262.

In some implementations, the first number of rows refers to two rows, the second number of rows refers to one row. Two rows of pixel driving units 162 are configured to drive, sequentially from row to row, the corresponding one row of first pixel units 1262.

Correspondingly, the number of pixel driving units 162 in each row of the two rows may be less than the number of first pixel units 1262 in each row. In this way, pixel driving units 162 in one row of the two rows may firstly drive, along the row extension direction, a part of the first pixel units 1262 in the corresponding one row. Subsequently, pixel driving units 162 in the other one row of the two rows may drive, along the row extension direction, a next part of the first pixel units 1262 in the corresponding one row. In this way, the two rows of pixel driving units 162 are configured to drive, sequentially from row to row, the corresponding one row of first pixel units 1262.

In some embodiments, the first number of rows of pixel driving units 162 are configured to drive the corresponding second number of rows of first pixel units 1262 successively, and a spacing between a part of first pixel units 1262 driven by pixel driving units 162 in one row of the first number of rows and another part of first pixel units 1262 driven by pixel driving units 162 in another row of the first number of rows next to the one row is the third number of columns. The third number is determined based on the first number.

In detail, the third number equals the first number minus one. In this way, the pixel driving units 162 in the first number of rows may be configured to drive the first number of first pixel units 1262, which are consecutively arranged in one row, at the same time.

For example, for n rows of pixel driving units 162 and m rows of first pixel units 1262, first pixel unit 1262 in a first row may be driven firstly. At this time point, a first pixel driving unit 162 in the i-th row drives the i-th first pixel unit 162 in the first row, and the j-th pixel driving unit 162 in the i-th row drives the (nj−n+i)-th pixel driving unit 1262 in the first row, where i≤n, j≤the number of first pixels in each row/n, and the i and the j are positive integers. After the first pixel units 1262 in the first row are driven, the remaining first pixel units 1262 are driven by the pixel driving units from row to row in sequence. When the pixel driving units 162 corresponding to the n rows are operating simultaneously, the pixel driving units 162 may simultaneously drive n first pixel units 1262, which are arranged consecutively in each row. In this case, the n rows of pixel driving units 162 are configured to drive the corresponding second number of rows of first pixel units 1262 successively, and a spacing between a part of first pixel units 1262 driven by pixel driving units 162 in one row of the n rows and another part of first pixel units 1262 driven by pixel driving units 162 in another row of the n rows next to the one row is the n−1 columns.

In some implementations, the first number of rows refers to two rows, and the second number of rows refers to one row. The two rows of pixel driving units 162 are respectively configured to drive the first pixel units 1262 of the corresponding one row in sequence, and a spacing between a part of first pixel units 1262 driven by the pixel driving units 162 in one of the two rows and another part of first pixel units 1262 driven by the pixel driving units 162 in the other one of the two rows is one column.

In detail, the pixel driving units 162 in one of the two rows are configured to sequentially drive first pixel units 1262, which are arranged in odd columns of the corresponding row. The pixel driving units 162 in other one of the two rows are configured to sequentially drive first pixel units 1262, which are arranged in even columns of the corresponding row. In this way, in the first display region 12, a relatively high scanning frequency or a relatively long driving time may be achieved.

In some embodiments, the display screen 10 includes the array of pixel driving units 16 disposed in the second display region 14. Distribution of the pixel driving units 162 in the second sub-region 124 may be the same as distribution of the pixel driving units 162 in the second display region 14.

In this case, since a density of the array of first pixel units 126 in the second sub-region 124 is less than a density of the array of second pixel units 142 in the second display region 14, only a part of the pixel driving units 162 in the second sub-region 124 is required to drive the first pixel units 1262 in the second sub-region 124, such that another part of the pixel driving units 162 in the second sub-region 124 may be configured to drive the first pixel units 1262 in the first sub-region 122. Therefore, the utilization rate of the pixel driving units 162 in the second sub-region 124 may be improved, the area of the second sub-region 124 may be reduced, and therefore, an area of the first display region 12 is reduced.

In some embodiments, the pixel driving units 162 in the second display region 14 are in one-to-one correspondence with the second pixel units 1422 in the second display region 14.

In detail, one row of pixel driving units 162 in the second display region 14 corresponds to one row of second pixel units 1422, and one column of pixel driving units 162 in the second display region 14 corresponds to one column of second pixel units 1422.

In some embodiments, each first pixel unit 1262 includes a plurality of first sub-pixels, and each second pixel unit includes a plurality of second sub-pixels. For one color, a size of the first sub-pixel is larger than a size of the second sub-pixel, i.e., a size of the first sub-pixel of red is larger a size of the second sub-pixel of red; a size of the first sub-pixel of green is larger a size of the second sub-pixel of green; and a size of the first sub-pixel of blue is larger a size of the second sub-pixel of blue.

In this way, brightness of the first display region 12, which has a relatively low pixel density, may be ensured by increasing the size of the first sub-pixel, and the brightness of the first display region 12 of the display screen 10 may be same as brightness of the second display region 14 of the display screen 10.

In some embodiments, the plurality of first sub-pixels includes a red sub-pixel, a green sub-pixel and a blue sub-pixel. A center of the red sub-pixel, a center of the green sub-pixel and a center of the blue sub-pixel in each first pixel unit 1262 are connected to form a triangle.

It shall be understood that the visible light may be formed by mixing light in three primary colors of red, green and blue. The plurality of sub-pixels in different colors may be mixed to form light in different colors, by configuring the red sub-pixel, the green sub-pixel and the blue sub-pixel in each pixel sub-unit and a corresponding pixel arrangement, and by controlling brightness of the first sub-pixel in each color, such that the display screen 10 may display images in various colors.

Correspondingly, in some embodiments, the plurality of second sub-pixels includes a red sub-pixel, a green sub-pixel and a blue sub-pixel. In each second pixel unit 1422, a center of the red sub-pixel, a center of the green sub-pixel and a center of the blue sub-pixel are connected with each other to form a triangle.

That is, an arrangement of the plurality of first sub-pixels in each first pixel unit 1262 is the same as an arrangement of the plurality of second sub-pixels in the second pixel unit 1422. Since the pixel density of the second display region 14 is relatively high, the displaying effect of the display screen 12 may be ensured.

Of course, in other embodiments, the red sub-pixel, the green sub-pixel and the blue sub-pixel in each pixel unit may be in a standard RGB arrangement, a delta arrangement, or a Pentile arrangement, and so on. The arrangement of the sub-pixels in each pixel unit will not be limited herein.

In some embodiments, each of the plurality of first sub-pixels and second sub-pixels may further include a white sub-pixel. The number of sub-pixels in each color in each first pixel unit 1262 and/or in each second pixel unit 1422 may be determined based on actual needs. In the embodiment shown in the drawings, each of the first pixel unit 1262 and the second pixel unit 1422 includes one red sub-pixel, one green sub-pixel and one blue sub-pixel.

In some embodiments, the size of each first sub-pixel in the first pixel unit 1262 is greater than the size of the corresponding second sub-pixel in the second pixel unit 1422. That is, the size of the red sub-pixel in the first pixel unit 1262 is greater than the size of the red sub-pixel in the second pixel unit 1422; the size of the green sub-pixel in the first pixel unit 1262 is greater than the size of the green sub-pixel in the second pixel unit 1422; and the size of the blue sub-pixel in the first pixel unit 1262 is greater than the size of the blue sub-pixel in the second pixel unit 1422.

Figure 6:
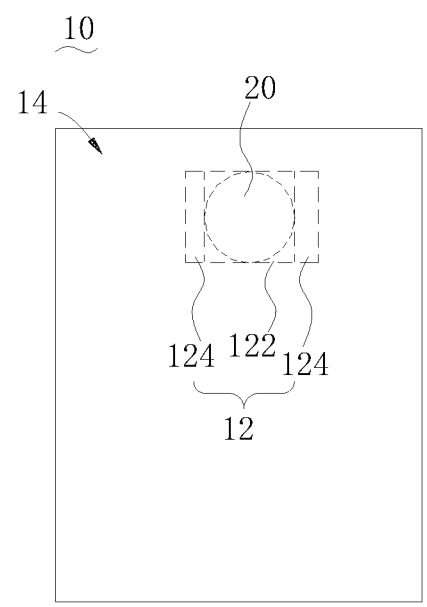
FIG. 6 is another plan view of a display screen according to an embodiment of the present disclosure.
Figure 7:
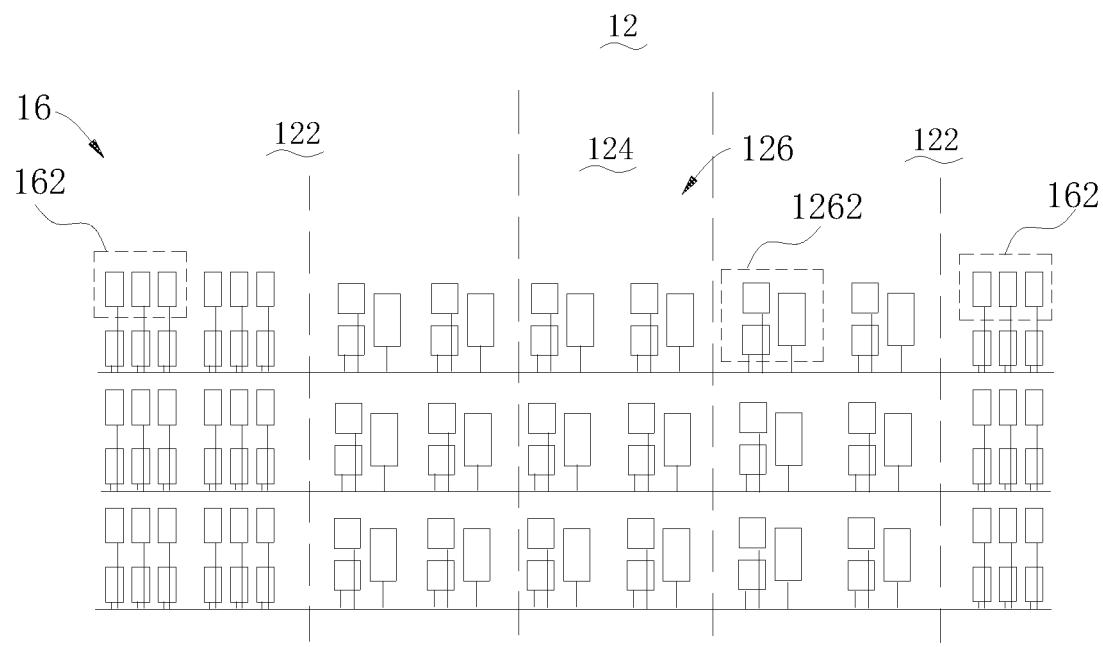
FIG. 7 is still another structural schematic view of an array of pixel units of a display screen according to an embodiment of the present disclosure.

As shown in FIG. 6 and FIG. 7, in some embodiments, there are two second sub-regions 124, and the two second sub-regions 124 are located on opposite sides of the first sub-region 122 respectively. In some embodiments, the second sub-region 124 is configured to surround the first sub-region 122.

In detail, the two second sub-regions 124 may be respectively located on opposite sides of the first sub-region 122 along the row extension direction of the first pixel unit 1262. In this way, the two oppositely disposed second sub-regions 124 enable the pixel driving unit 162 in the second sub-region 124 to be connected to the first pixel unit 126, which is disposed near the pixel driving unit 162, facilitating line connection in the first display region 12.

Figure 8:
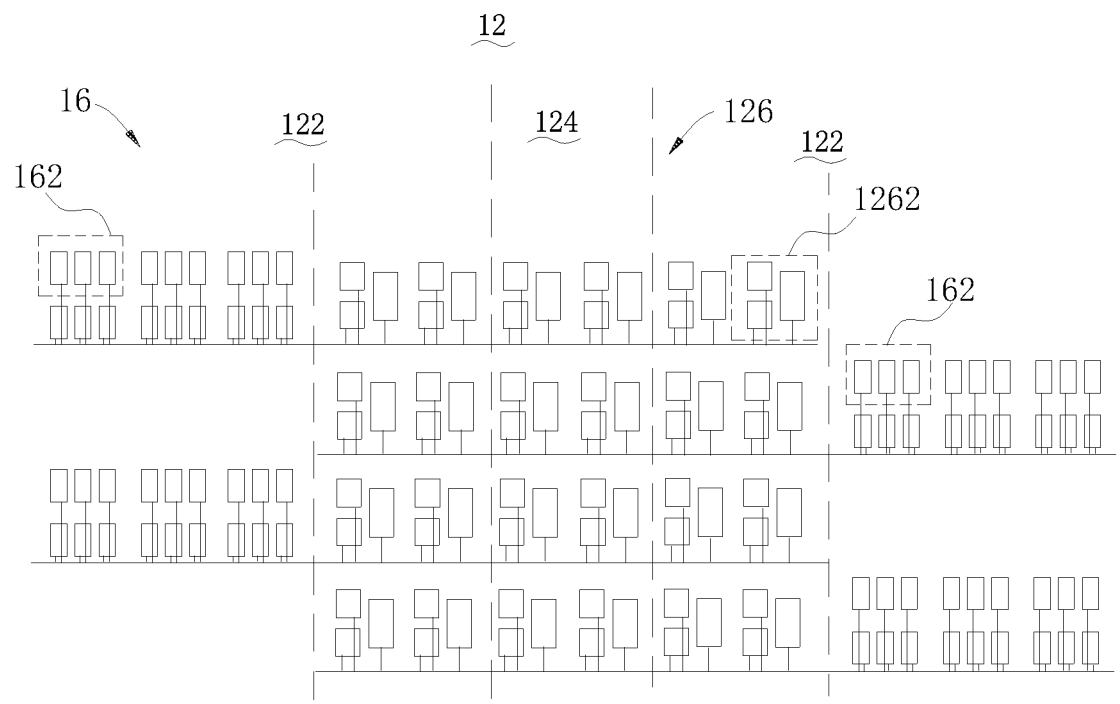
FIG. 8 is still another structural schematic view of an array of pixel units of a display screen according to an embodiment of the present disclosure.

Of course, as shown in FIG. 8, in other embodiments, the first number of rows of pixel driving units 162 corresponding to the second number of rows of first pixel units 1262 may be alternately arranged in two opposite second sub-regions. In this way, the line connection in the first display region 12 may also be achieved easily.

In some embodiments, the first display region 12 and the second display region 14 may be arranged side by side. Alternatively, the second display region 14 may be arranged to surround the first display region 12. In some embodiments, a plurality of first display regions 12 may be arranged.

Figure 9:
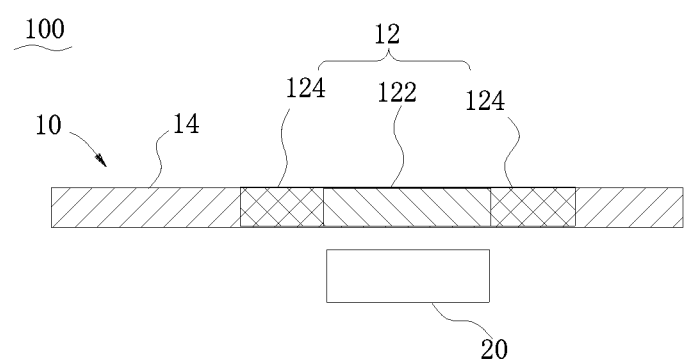
FIG. 9 is a cross-sectional view of an electronic device according to an embodiment of the present disclosure.

As shown in FIG. 1 and FIG. 9, the present disclosure provides an electronic device 100 including the display screen 10 of any of the above-mentioned embodiments and a photosensitive module 20. The photosensitive module 20 is disposed on a rear side of the display screen 10 and is corresponding to the first sub-region 122.

In the electronic device 100 of the present embodiment, the display screen 10 is arranged with the first display region 12 and the second display region 14 having different pixel densities. The first display region 12 having the relatively low pixel density may have a high light transmission. Further, the pixel driving units 162 of the first display region 12 are arranged in the second sub-region 126, such that the pixel driving unit 162 may not be arranged in the first sub-region 124. In this way, the influence on the light passing through the first sub-region 124 caused by the pixel driving unit 162 arranged in the first sub-region 124 may be avoided or reduced. in addition, the larger number of rows of pixel driving units 162 may be arranged corresponding to the less number of rows of first pixel units 1262, such that the utilization rate of the pixel driving units 162 in the second sub-region 126 may be improved, the area of the second sub-region 126 may be reduced, and the area of the first display region 12 may be reduced. Since the pixel density of the first display region 12 is relatively low, the displaying effect is relatively poor, and an overall visual effect of the display screen 10 may be improved by reducing the area of the first display region 12.

In some embodiments, the photosensitive module 20 includes one or more of electronic modules, such as an imaging module, an ambient light sensor, a proximity sensor, and an optical fingerprint module.

It shall be understood that the imaging module, the ambient light sensor, the proximity sensor and the optical fingerprint module, and so on, may be arranged under the display screen 10, such that a through hole may not be defined in a side of the display screen 10 for allowing the light to pass through, and the electronic device 100 may display contents on the full screen. Further, for the display screen 10 of the embodiment of the present disclosure, the light transmittance and the displaying effect of the first display region 12 may be improved, and an accuracy of the light sensing module sensing the light may be ensured.

Although the embodiments of the present disclosure are shown and described above, it shall be understood that the above embodiments are exemplary and shall not be interpreted as limiting the present disclosure. Any ordinary skilled person in the art may perform variations, modifications, replacements and transformation on the above-mentioned embodiments within the scope of the present disclosure.

What is claimed is:

1. A display screen, comprising:
   a first display region, arranged with an array of first pixel units; and
   a second display region, arranged with an array of second pixel units;
   wherein the first display region comprises a first sub-region and a second sub-region, the second sub-region is adjacent to and connected with the first sub-region and the second display region;
   wherein the display screen further comprises an array of pixel driving units disposed in the second sub-region, each pixel driving unit of the array of pixel driving units is configured to drive a respective one first pixel unit of the array of first pixel units; and
   wherein a first number of rows of pixel driving units are arranged in a row extension direction and are corresponding to a second number of rows of first pixel units, the first number is greater than the second number.

2. The display screen according to claim 1, wherein a sub-pixel, which is disposed in the first display region, and another sub-pixel, which is disposed in the second display region and has a same color as the sub-pixel in the first display region, have different shapes.

3. The display screen according to claim 1, wherein a row extension direction of the pixel units is the same as the row extension direction of the pixel driving units.

4. The display screen according to claim 1, wherein the first number of rows of pixel driving units are configured to drive the corresponding second number of rows of first pixel units.

5. The display screen according to claim 4, wherein the first number of rows is two rows, the second number of rows is one row, and the two rows of pixel driving units are configured to drive, sequentially from row to row, the corresponding one row of first pixel units.

6. The display screen according to claim 1, wherein the first number of rows of pixel driving units are configured to drive the corresponding second number of rows of first pixel units successively, and a spacing between a part of the first pixel units driven by pixel driving units in one row of the first number of rows and another part of the first pixel units driven by pixel driving units in another row of the first number of rows next to the one row is a third number of columns, and the third number is determined based on the first number.

7. The display screen according to claim 6, wherein the first number of rows is two rows, and the second number of rows is one row, the two rows of pixel driving units are respectively configured to drive the corresponding one row of first pixel units in sequence, and a spacing between a part of first pixel units driven by the pixel driving units in a first one of the two rows and another part of first pixel units driven by the pixel driving units in the othera second one of the two rows is one column.

8. The display screen according to claim 1, wherein each first pixel unit of the array of first pixel units comprises a plurality of first sub-pixels, and each second pixel unit of the array of second pixel units comprises a plurality of second sub-pixels; and
   for one color, a size of each of the plurality of first sub-pixels is larger than a size of each of the plurality of second sub-pixels.

9. The display screen according to claim 1, wherein two second sub-regions are arranged, and the two second sub-regions are located on opposite sides of the first sub-region respectively.

10. The display screen according to claim 1, wherein the second sub-region is configured to surround the first sub-region.

11. The display screen according to claim 9, wherein the first number of rows of pixel driving units corresponding to the second number of rows of first pixel units are alternately arranged in the two oppositely located second sub-regions.

12. The display screen according to claim 1, wherein a number of pixel driving units in the second sub-region is not less than a number of first pixel units in the first display region.

13. The display screen according to claim 1, wherein the array of first pixel units comprise an array of organic light emitting diode (OLED) units; and the array of pixel driving units comprises a thin film transistor.

14. The display screen according to claim 1, further comprising a transparent conductive material, wherein the pixel driving units in the second sub-region are connected to the first pixel units through the transparent conductive material; and the transparent conductive material is indium tin oxide and/or indium gallium zinc oxide.

15. The display screen according to claim 1, further comprising an array of pixel driving units disposed in the second display region, wherein distribution of the pixel driving units in the second sub-region is the same as distribution of the pixel driving units in the second display region.

16. The display screen according to claim 15, wherein the pixel driving units in the second display region are in one-to-one correspondence with the second pixel units in the second display region.

17. The display screen according to claim 1, wherein a pixel density of the first display region is less than a pixel density of the second display region.

18. An electronic device, comprising:
    a display screen and a photosensitive module;
    wherein the display screen comprises:
       a first display region, arranged with an array of first pixel units; and
       a second display region, arranged with an array of second pixel units;
    wherein the first display region comprises a first sub-region and a second sub-region, the second sub-region is adjacent to and connected with the first sub-region and the second display region;
    wherein the display screen further comprises an array of pixel driving units disposed in the second sub-region, each pixel driving unit of the array of pixel driving units is configured to drive a respective one first pixel unit of the array of first pixel units;
    wherein a first number of rows of pixel driving unit are arranged in a row extension direction and are corresponding to a second number of rows of first pixel units, the first number is greater than the second number; and
    wherein the photosensitive module is arranged at a rear side of the display screen and corresponding to the first sub-region.

19. The electronic device according to claim 18, wherein a shape of a first sub-pixel of the array of first pixel units in the first display region is the same as or different from a shape of a second sub-pixel of the array of second pixel units in the second display region, and the first sub-pixel and the second sub-pixel are in a same color.

20. The electronic device according to claim 18, wherein the first number of rows of pixel driving units are configured to drive the corresponding second number of rows of first pixel units.

\* \* \* \* \*